United States Patent
Kim et al.

(10) Patent No.: US 8,400,116 B2
(45) Date of Patent: Mar. 19, 2013

(54) METHOD AND APPARATUS FOR CALCULATING POWER-OFF DURATION TIME AND STATE OF CHARGING OF BATTERY

(75) Inventors: Ju-Young Kim, Daejeon (KR); Jong-Min Park, Daejeon (KR); Jun-Ill Yoon, Seoul (KR); Do-Youn Kim, Daejeon (KR); Do-Yang Jung, Gyeonggi-do (KR)

(73) Assignee: LG Chem, Ltd., Seoul (KR)

( * ) Notice: Subject to any disclaimer, the term of this patent is extended or adjusted under 35 U.S.C. 154(b) by 719 days.

(21) Appl. No.: 12/299,592

(22) PCT Filed: May 4, 2007

(86) PCT No.: PCT/KR2007/002211
§ 371 (c)(1),
(2), (4) Date: Mar. 5, 2009

(87) PCT Pub. No.: WO2007/129843
PCT Pub. Date: Nov. 15, 2007

(65) Prior Publication Data
US 2009/0174410 A1    Jul. 9, 2009

(30) Foreign Application Priority Data
May 4, 2006   (KR) .................. 10-2006-0040619

(51) Int. Cl.
*H02J 7/00* (2006.01)
(52) U.S. Cl. ....................... 320/166; 320/133
(58) Field of Classification Search .............. 320/166
See application file for complete search history.

(56) References Cited

U.S. PATENT DOCUMENTS

| | | | |
|---|---|---|---|
| 4,447,764 A * | 5/1984 | Kornrumpf et al. | 315/240 |
| 6,198,252 B1 | 3/2001 | Mukainakano | |
| 6,661,231 B1 * | 12/2003 | Arai et al. | 324/426 |
| 7,560,904 B2 * | 7/2009 | Alvarez-Troncoso | 320/166 |
| 7,688,047 B2 * | 3/2010 | Sugiyama et al. | 323/268 |
| 2002/0014879 A1 * | 2/2002 | Koike et al. | 320/133 |
| 2002/0099416 A1 * | 7/2002 | Dooley et al. | 607/29 |
| 2002/0190694 A1 | 12/2002 | Saeki et al. | |
| 2003/0214269 A1 * | 11/2003 | Shiue et al. | 320/166 |
| 2004/0018419 A1 * | 1/2004 | Sugimoto et al. | 429/61 |
| 2004/0113591 A1 * | 6/2004 | Bradley et al. | 320/133 |
| 2004/0257042 A1 | 12/2004 | Liu et al. | |
| 2005/0194947 A1 * | 9/2005 | Murai et al. | 323/265 |

FOREIGN PATENT DOCUMENTS

| | | |
|---|---|---|
| KR | 10-1999-0088544 A | 12/1999 |
| KR | 10-2000-0076890 A | 12/2000 |
| KR | 10-2004-0111144 A | 12/2004 |
| KR | 10-2006-0011484 A | 2/2006 |

* cited by examiner

*Primary Examiner* — Arun Williams
(74) *Attorney, Agent, or Firm* — Birch, Stewart, Kolasch & Birch, LLP

(57) ABSTRACT

An apparatus for controlling a battery includes a capacitor for charging a voltage when the apparatus is on and discharging a voltage when the apparatus is off, a discharging circuit for discharging the voltage charged in the capacitor; a first switching unit for connecting or disconnecting the capacitor to/from a predetermined power source for the purpose of charging of the capacitor; a second switching unit for connecting or disconnecting the capacitor to/from the discharging unit; a voltage measuring unit for measuring a voltage charged in the capacitor; and a controller for calculating a power-off duration time according to the measured voltage. This apparatus may continuously calculate a power-off duration time of a battery pack.

7 Claims, 2 Drawing Sheets

METHOD AND APPARATUS FOR CALCULATING POWER-OFF DURATION TIME AND STATE OF CHARGING OF BATTERY

TECHNICAL FIELD

The present invention relates to method and apparatus for controlling a battery, and more particularly to method and apparatus for minimizing a calculation error of a charging capacity of a battery by calculating a power-off duration time.

BACKGROUND ART

Generally, if a state of charging of a battery is lowered below a predetermined value, a portable electronic device comes to a power-saving mode in order to protect data under working using the portable electronic device or prevent any abnormal operation caused by the battery in a state of low charging, thereby allowing the portable electronic device to operate stably.

However, the charging capacity of the battery is frequently measured erroneously due to the number of charging the battery, an abrupt temperature change of surroundings, instability of a battery pack, or the like.

In more detail, a battery pack (or, a secondary battery) such as a lithium-ion battery becomes unstable when it is turned off just after charging/discharging and then it is turned on again, so an open voltage of the battery pack may be not corresponding to a real charging capacity.

In case the open voltage of the battery pack is not corresponding to a real charging capacity as mentioned above, a charging capacity calculated based on the open voltage of the battery pack becomes inaccurate.

This battery pack becomes stable after a predetermined power-off duration time. Thus, it has been strongly pursued to develop a technique capable of improving calculation accuracy of a state of charging by calculating a power-off duration time and then calculating a state of charging of a battery in different ways depending on the calculated power-off duration time.

DISCLOSURE

Technical Problem

The present invention is designed to overcome the drawbacks of the prior art, and therefore it is an object of the invention to provide apparatus and method for controlling a battery, which is capable of calculating a power-off duration time of a battery pack.

Another object of the present invention is to provide apparatus and method for controlling a battery, which is capable of improving calculation accuracy of a state of charging of a battery by calculating a state of charging of a battery pack in different ways depending on a power-off duration time of the battery pack.

Technical Solution

In order to accomplish the above object, the present invention provides an apparatus for controlling a battery, which includes: a capacitor for charging a voltage when the apparatus is on and discharging a voltage when the apparatus is off; a discharging circuit for discharging the voltage charged in the capacitor; a first switching unit for connecting or disconnecting the capacitor to/from a predetermined power source for the purpose of charging of the capacitor; a second switching unit for connecting or disconnecting the capacitor to/from the discharging unit; a voltage measuring unit for measuring a voltage charged in the capacitor; and a controller for calculating a power-off duration time according to the measured voltage.

In another aspect of the present invention, there is also provided an apparatus for controlling a battery, which includes: a power-off duration time detection unit including a charging circuit for charging a voltage when the apparatus is on and discharging a voltage when the apparatus is off; and a controller for calculating a power-off duration time according to the voltage charged in the charging circuit when the apparatus is on, calculating a state of charging (SOC) of a battery pack according to an open voltage of the battery pack when the apparatus is on in case the power-off duration time exceeds a predetermined time, estimating an open voltage according to a characteristic curve representing a stabilization of the battery pack in case the power-off duration time is less than the predetermined time, and calculating a SOC of the battery based on the estimated open voltage.

In still another aspect of the present invention, there is also provided a method for controlling a battery, which includes: when power is off, measuring and storing a charging voltage of a charging element, which has been charged when power is on, and also discharging the charging element; and measuring a charging voltage of the charging element when power is on, and calculating a power-off duration time according to a difference between the measured charging voltage and the stored charging voltage.

In particularly, this method may further include: checking whether the power-off duration time is less than a predetermined time; and in case the power-off duration time exceeds the predetermined time, calculating a SOC of a battery pack according to an open voltage of the battery pack when power is on, but, in case the power-off duration time is less than the predetermined time, estimating an open voltage according to a characteristic curve representing a stabilization of the battery pack and then calculating a SOC of the battery pack based on the estimated open voltage.

REFERENCE NUMERALS OF ESSENTIAL PARTS IN THE DRAWINGS

Figure 1:
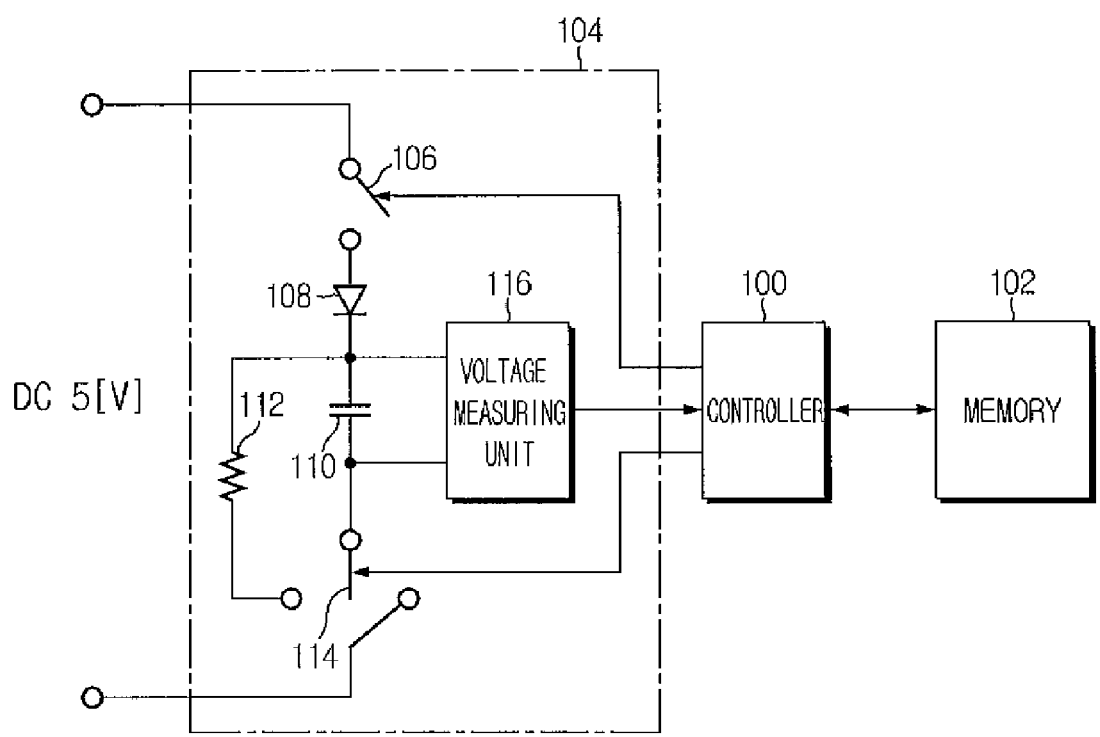
FIG. 1 is a block diagram showing a battery management system according to a preferred embodiment of the present invention.

100: controller
102: memory
104: power-off duration time detection unit
106: first switching unit
108: diode
110: capacitor
112: discharging resistance (discharging circuit)
114: second switching unit
116: voltage measuring unit

BEST MODE

The present invention may improve calculation accuracy of a state of charging (SOC) of a battery when the battery is reactivated, in a way of calculating a power-off duration time of a battery pack and then calculating a SOC of the battery pack in different ways depending on the calculated power-off duration time.

The configuration of an apparatus for controlling a battery (or, a battery management system (BMS)) according to a preferred embodiment of the present invention will be described with reference to FIG. 1.

A controller 100 of the BMS generally controls the BMS, and also continuously calculates a power-off duration time to calculate a SOC of the battery pack in different ways depending on the calculated power-off duration time according to the preferred embodiment of the present invention.

A memory 102 stores various information including a control program of the controller 100, and particularly stores a full-charging voltage of a capacitor 110 and a power-off charging voltage of the capacitor 110 according to the preferred embodiment of the present invention.

A power-off duration time detection unit 104 includes a capacitor 110 connected to an output terminal of a predetermined power source (DC 5[V]) to receive and charge the predetermined power when the BMS is on and also discharge the power when the BMS is off a voltage measuring unit 116 for measuring a charging voltage of the capacitor 110, first and second switching units 106, 114, a discharging resistance 112, and a protection diode 108.

Seeing the operation of the power-off duration time detection unit 104 in more detail, the switching units 106, 114 connect the capacitor 110 to both ends of the predetermined power source according to the control of the controller 100, or disconnect the capacitor 110 from the predetermined power source and connect the capacitor 110 to the discharging resistance 112.

The discharging resistance 112 is one example that represents a discharging circuit of the present invention, and it should be understood that the circuit having at least one resistance element may be modified in various ways if it may discharge a voltage charged in the capacitor.

The diode 108 intercepts a charging voltage of the capacitor 110 not to flow back to the predetermined power source.

The voltage measuring unit 116 measures voltages at both ends of the capacitor 110 and provides its result to the controller 100. Here, the measured voltages are expressed as a R-C discharging curve, which is an exponential function, by means of the capacitor 110 and the resistance 112, so it corresponds to a power-off duration time.

The capacitor 110 may adopt a low-ESR product, a film capacitor having a low aging rate and a low self-discharging rate, or the like, and the resistance 112 may adopt a discharging resistance with high precision.

In addition, the capacitor 110 and the resistance 112 may adopt elements with aging characteristics contrary to each other, such that their deteriorations caused by operation may give a minimized influence on the discharging curve.

The capacitor 110 has a discharging time of about 1 hour, which corresponds to a stabilizing time of the battery pack. This time should be suitably selected depending on characteristics of the battery.

Figure 2:
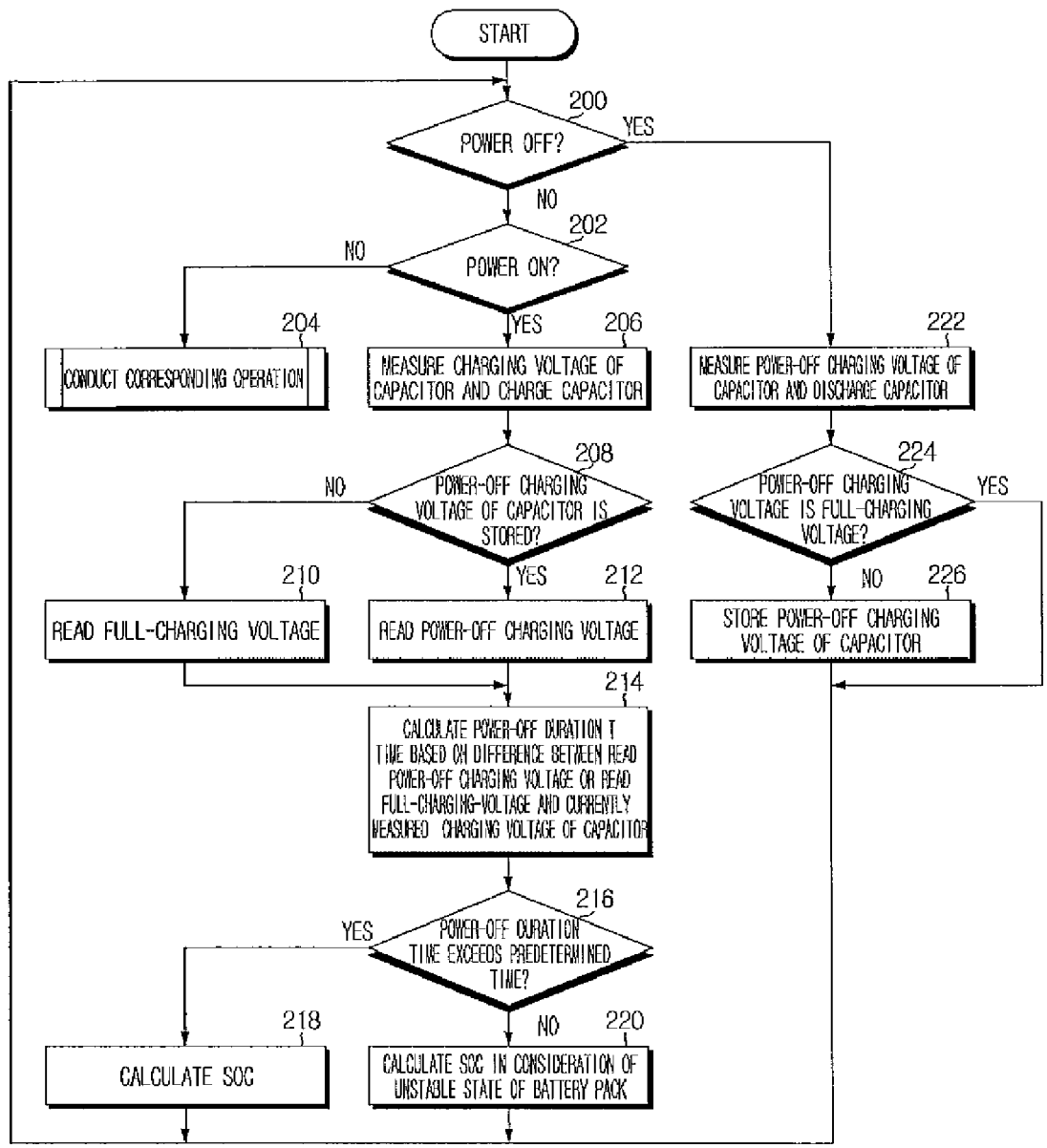
FIG. 2 is a flowchart illustrating a method for controlling a battery according to a preferred embodiment of the present invention.

Now, operations of the BMS will be explained in detail with reference to FIG. 2.

The controller 100 checks whether the BMS is turned on or off (Steps 200, 202).

If the BMS is turned on, the controller 100 measures a charging voltage of the capacitor 110 using the voltage measuring unit 116, and also controls the first and second switching units 106, 114 to connect the capacitor 110 with the predetermined power source (Step 206). Here, as the capacitor 110 is connected with the predetermined power source, the capacitor 110 is charged.

If the charging voltage of the capacitor 110 is measured, the controller 100 checks whether a power-off charging voltage of the capacitor 110 during a power-off state is stored in the memory 102 (Step 208). If the power-off charging voltage of the capacitor 110 is stored, the controller 100 reads the stored power-off charging voltage, and then calculates a power-off duration time based on a difference between the read power-off charging voltage and the current charging voltage of the capacitor 110 (Steps 212, 214).

If a power-off charging voltage of the capacitor 110 is not stored in the memory 102 differently from the above, the controller 100 reads a full-charging voltage of the capacitor 110, stored in the memory 102, and then calculates a power-off duration time based on a difference between the read full-charging voltage and the current charging voltage of the capacitor 110 (Steps 210, 214).

After that, the controller 100 checks whether the power-off duration time exceeds a predetermined time, for example 1 hour, (Step 216). The power-off duration time is calculated using a RTC (Real Time Clock) mounted to an interior or exterior of the controller 100. If the power-off duration time exceeds the predetermined time, the controller 100 determines that the battery pack is sufficiently stabilized, and then measures an open voltage to calculate a SOC (Step 218).

If the power-off duration time is less than the predetermined time differently from the above, the controller 100 determines that the battery pack is currently unstable, and then calculates a SOC in consideration of the unstable state of the battery pack. To calculate a SOC in consideration of the unstable state of the battery pack, the SOC may be calculated after estimating a stabilizing time and an open voltage at the stabilizing time after the BMS is turned on.

That is to say, if a power-off duration time calculated by the capacitor 110 is less than the predetermined time, the controller 100 estimates an open voltage at an end point of a characteristic curve representing a stabilization of the battery from a final current applied to the battery, and then calculates a SOC of the battery based on the estimated open voltage.

If the BMS is turned off differently from the above, the controller 100 measures a charging voltage of the capacitor 110 using the voltage measuring unit 116, and at the same time disconnects the capacitor 110 from the predetermined power source and controls the first and second switching units 106, 114 to connect the capacitor 110 with the discharging resistance 112 (Step 222). Here, as the capacitor 110 is connected with the discharging resistance 112, the capacitor 110 is discharged.

After that, the controller 100 stores the measured charging voltage of the capacitor to the memory 102 (Step 226).

INDUSTRIAL APPLICABILITY

As described above, the battery management system (BMS) of the present invention calculates a power-off duration time of a battery pack and calculates a state of charging (SOC) of the battery pack in different ways depending on the calculated power-off duration time, thereby improving the calculation accuracy of SOC.

The present invention has been described based on the embodiments and drawings. However, it should be understood that the present invention is not limited to the above embodiments, and there can be made various changes and modifications from the above by those having ordinary skill in the art.

Thus, the spirit of the present invention should be understood only from the appended claims, and its equivalents and equivalent modifications are also included in the scope of the present invention.

The invention claimed is:

1. An apparatus for controlling a battery, comprising:
   a capacitor for charging a voltage when the apparatus is on and discharging a voltage when the apparatus is off;
   a discharging circuit for discharging the voltage charged in the capacitor;
   a first switching unit for connecting or disconnecting the capacitor to/from a predetermined power source for the purpose of charging of the capacitor;
   a second switching unit for connecting or disconnecting the capacitor to/from the discharging unit;
   a voltage measuring unit for measuring a power-off charging voltage of the capacitor when the apparatus is off and a charging voltage of the capacitor when the apparatus is on;
   a controller for calculating a power-off duration time according to a difference between the power-off charging voltage or a full-charging voltage of the capacitor and the charging voltage; and
   a memory for storing the full-charging voltage and the power-off charging voltage,
   wherein the controller reads the full-charging voltage or the power-off charging voltage, stored in the memory, and then calculates a power-off duration time based on a difference between the read full-charging voltage or the read power-off charging voltage and the measured charging voltage.

2. The apparatus for controlling a battery according to claim 1, further comprising a diode for intercepting the voltage charged in the capacitor not to flow to the predetermined power source.

3. An apparatus for controlling a battery, comprising:
   a power-off duration time detection unit including a charging circuit for charging a voltage when the apparatus is on and discharging a voltage when the apparatus is off; and
   a controller for calculating a power-off duration time according to the voltage charged in the charging circuit when the apparatus is on, calculating a state of charging (SOC) of a battery pack according to an open voltage of the battery pack when the apparatus is on in case the power-off duration time exceeds a predetermined time, estimating an open voltage according to a characteristic curve representing a stabilization of the battery pack in case the power-off duration time is less than the predetermined time, and calculating a SOC of the battery based on the estimated open voltage.

4. The apparatus for controlling a battery according to claim 3, wherein the power-off duration time detection unit includes:
   a capacitor for charging a voltage when the apparatus is on and discharging a voltage when the apparatus is off;
   a discharging circuit for discharging the voltage charged in the capacitor;
   a first switching unit for connecting or disconnecting the capacitor to/from a predetermined power source for the purpose of charging of the capacitor;
   a second switching unit for connecting or disconnecting the capacitor to/from the discharging circuit; and
   a voltage measuring unit for measuring a voltage charged in the capacitor and providing the measured voltage to the controller.

5. The apparatus for controlling a battery according to claim 4, further comprising a memory for storing a full-charging voltage of the capacitor or a charging voltage when power is off,
   wherein the controller reads the full-charging voltage or the power-off charging voltage, stored in the memory, and then calculates a power-off duration time based on a difference between the read full-charging voltage or the read power-off charging voltage and the measured charging voltage.

6. A method for controlling a battery, comprising:
   when power is off, measuring and storing a charging voltage of a charging element, which has been charged when power is on, and also discharging the charging element; and
   measuring a charging voltage of the charging element when power is on, and calculating a power-off duration time according to a difference between the measured charging voltage and the stored charging voltage.

7. The method for controlling a battery according to claim 6, further comprising:
   checking whether the power-off duration time is less than a predetermined time; and
   in case the power-off duration time exceeds the predetermined time, calculating a SOC of a battery pack according to an open voltage of the battery pack when power is on, but, in case the power-off duration time is less than the predetermined time, estimating an open voltage according to a characteristic curve representing a stabilization of the battery pack and then calculating a SOC of the battery pack based on the estimated open voltage.

* * * * *